(12) United States Patent  
Greenberg et al.

(10) Patent No.: US 7,537,676 B2
(45) Date of Patent: May 26, 2009

(54) CATHODE APPARATUS TO SELECTIVELY BIAS PALLET DURING SPUTTERING

(75) Inventors: Thomas Larson Greenberg, Berkeley, CA (US); Paul Stephen McLeod, Berkeley, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 152 days.

(21) Appl. No.: 10/844,653

(22) Filed: May 12, 2004

(65) Prior Publication Data

US 2005/0252766 A1     Nov. 17, 2005

(51) Int. Cl.
   *C23C 14/35*     (2006.01)
(52) U.S. Cl. .............................. 204/192.12; 204/192.13; 204/298.03; 204/298.06; 204/298.11; 204/298.14; 204/298.26; 204/298.25
(58) Field of Classification Search ............ 204/192.12, 204/192.13, 192.2, 298.03, 298.06, 298.08, 204/298.11, 298.15, 298.25, 298.26, 298.14
   See application file for complete search history.

(56) References Cited

U.S. PATENT DOCUMENTS

| | | | |
|---|---|---|---|
| 4,466,872 A | 8/1984 | Einbinder | |
| 4,981,566 A * | 1/1991 | Wurczinger | 204/192.13 |
| 5,683,561 A | 11/1997 | Hollars et al. | |
| 5,948,215 A * | 9/1999 | Lantsman | 204/192.12 |
| 6,063,245 A * | 5/2000 | Frach et al. | 204/192.15 |
| 6,156,171 A | 12/2000 | Hollars et al. | |
| 6,231,732 B1 | 5/2001 | Hollars et al. | |
| 6,338,777 B1 | 1/2002 | Longstreth White | |
| 7,041,202 B2 * | 5/2006 | McLeod | 204/192.12 |
| 2003/0150712 A1 | 8/2003 | Reiter et al. | |
| 2004/0069614 A1 | 4/2004 | McLeod | |

FOREIGN PATENT DOCUMENTS

WO        2004/013373       *  2/2004

* cited by examiner

*Primary Examiner*—Rodney G McDonald
(74) *Attorney, Agent, or Firm*—Dergosits & Noah LLP (57) ABSTRACT

A system and method for sputtering having a substrate holder, the target-cathode and the shield that are all electrically isolated from each other and are all capable of independently being subjected to different voltages. The substrate holder can be a pallet that holds a plurality of substrates. The system further includes a plurality of target-cathodes and shields disposed along the path of travel of the moving substrate holder, and a controller configured to selectively vary the target-cathode voltage, the shield voltage, and the pallet bias voltage while the pallet moves along the path of travel. The target-cathodes and shields are spaced apart along the path of travel by a distance less than a length of the pallet and on both sides of the path of travel. The controller can include a timing circuit for synchronizing changes in the target-cathode voltages with changes in the pallet bias voltage and shield voltage.

26 Claims, 9 Drawing Sheets

CATHODE APPARATUS TO SELECTIVELY BIAS PALLET DURING SPUTTERING

BACKGROUND OF THE INVENTION

1. Field of the Invention

The present invention relates generally to manufacturing processes involving the coating of substrates. More particularly, the present invention relates to apparatuses and methods used for sputtering thin films.

2. Description of the Related Art

Various manufacturing processes involve the deposition or coating of multiple layers of materials on a substrate by sputtering. A basic sputtering operation includes bombarding a target material with ions to release atoms from the surface of the target. The released atoms are directed towards the substrate so that they become deposited on the surface of the substrate. To build up the desired multiple layers of different materials, the sputtering operation is repeated with a previously coated substrate, using targets of different materials in each sputtering operation.

To increase production yield, pallets are used to support and transport the substrates through the various sputtering operations, with each pallet being designed to carry a plurality of substrates arranged in an array. To obtain desirable films characteristics as well as improve yields, a bias voltage is often applied to the substrates during the sputtering process. While using a pallet may be more efficient than processing the substrates individually, it also means that all the substrates on the same pallet are set to the same bias voltage. Since the deposition of different materials are optimized at different bias voltages, the targets for depositing one material have to be separated from the targets for depositing another material by at least the length of the pallet used. It follows that the manufacturing cost for depositing several layers of different materials increases significantly with the number of layers deposited.

The making of magnetic media used in conventional disc drives is one example. Conventional disc drives are used to magnetically record, store and retrieve digital data. Data is recorded to and retrieved from one or more discs that are rotated at more than one thousand revolutions per minute (rpm) by a motor. The data is recorded and retrieved from the discs by an array of vertically aligned read/write head assemblies, which are controllably moved from data track to data track by an actuator assembly.

The three major components making up a conventional hard disc drive are magnetic media, read/write head assemblies and motors. Magnetic media, which is used as a medium to magnetically store digital data, typically includes a layered structure, of which at least one of the layers is made of a magnetic material, such as CoCrPtB, having high coercivity and high remnant moment. The read/write head assemblies typically include a read sensor and a writing coil carried on an air bearing slider attached to an actuator. This slider acts in a cooperative hydrodynamic relationship with a thin layer of air dragged along by the spinning discs to fly the head assembly in a closely spaced relationship to the disc surface. The actuator is used to move the heads from track to track and is of the type usually referred to as a rotary voice coil actuator. A typical rotary voice coil actuator consists of a pivot shaft fixedly attached to the disc drive housing closely adjacent to the outer diameter of the discs. Motors, which are used to spin the magnetic media at rates higher than 10,000 revolutions per minute (rpm), typically include brushless direct current (DC) motors. The structure of disc drives is well known.

Figure 1A:
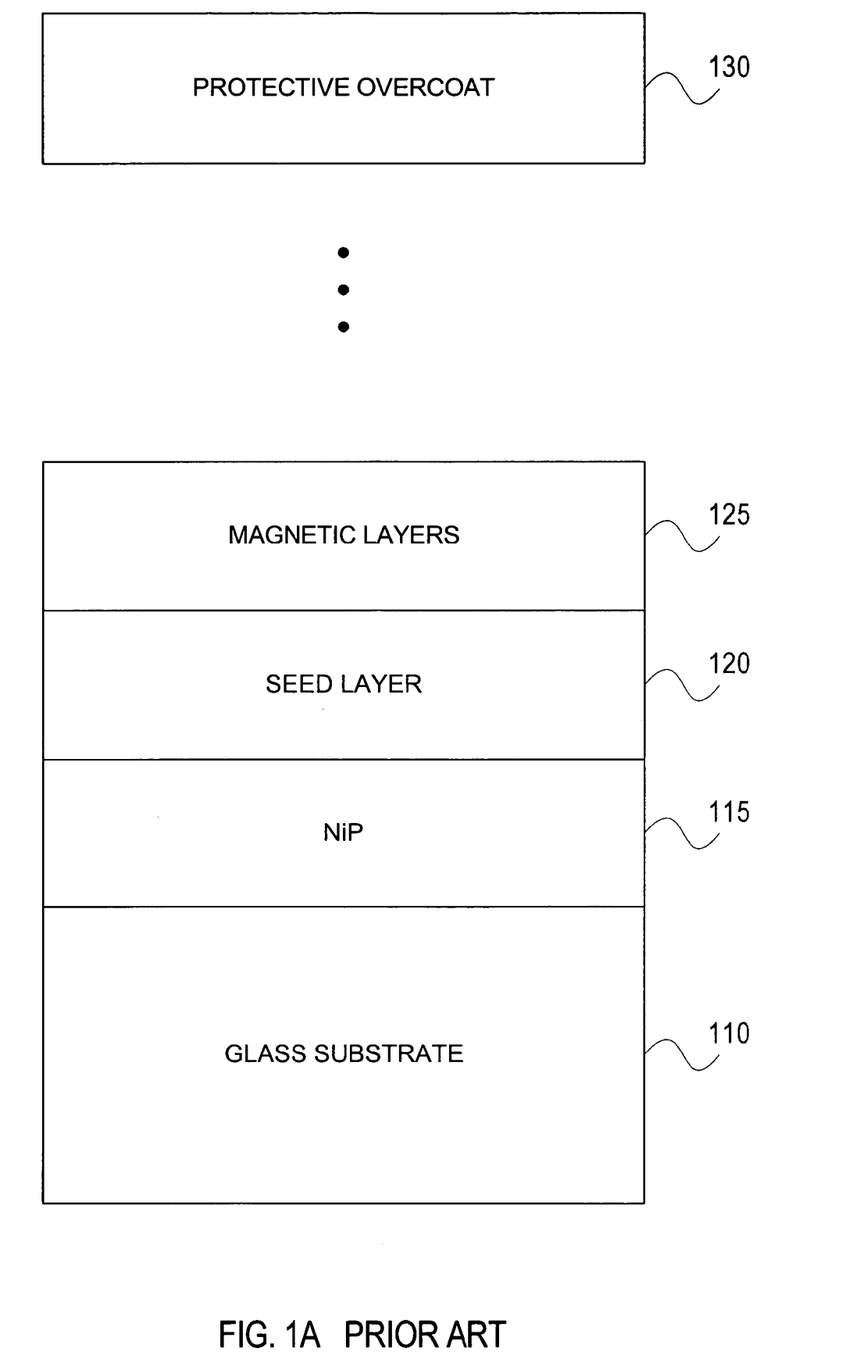
FIG. 1A is a block diagram showing a prior art conventional magnetic media structure.

FIG. 1A illustrates a conventional magnetic media structure comprising a substrate 110, a nickel-phosphorous (NiP) layer 115, a seed layer 120, a magnetic layer 125 and a protective layer 130. The substrate 110 is typically made of aluminum or high quality glass having few defects. The nickel-phosphorous (NiP) layer 115 is an amorphous layer that is usually electrolessly plated or sputtered onto the substrate 110. The NiP layer is used to enhance both the mechanical performance and magnetic properties of the disk. The NiP layer enhances the mechanical properties of the disk by providing a hard surface on which to texture. The magnetic properties are enhanced by providing a textured surface that improves the magnetic properties including the orientation ratio (OR).

Seed layer 120 is typically a thin film made of chromium that is deposited onto the NiP layer 115 and forms the foundation for structures that are deposited on top of it. Magnetic layer 125, which is deposited on top of seed layer 120, typically includes a stack of several magnetic and non-magnetic layers. The magnetic layers are typically made out of magnetic alloys containing cobalt (Co), platinum (Pt) and chromium (Cr), whereas the non-magnetic layers are typically made out of metallic non-magnetic materials. Finally, protective overcoat 130 is a thin film typically made of carbon and hydrogen, which is deposited on top of the magnetic layers 125 using conventional thin film deposition techniques.

Figure 1B:
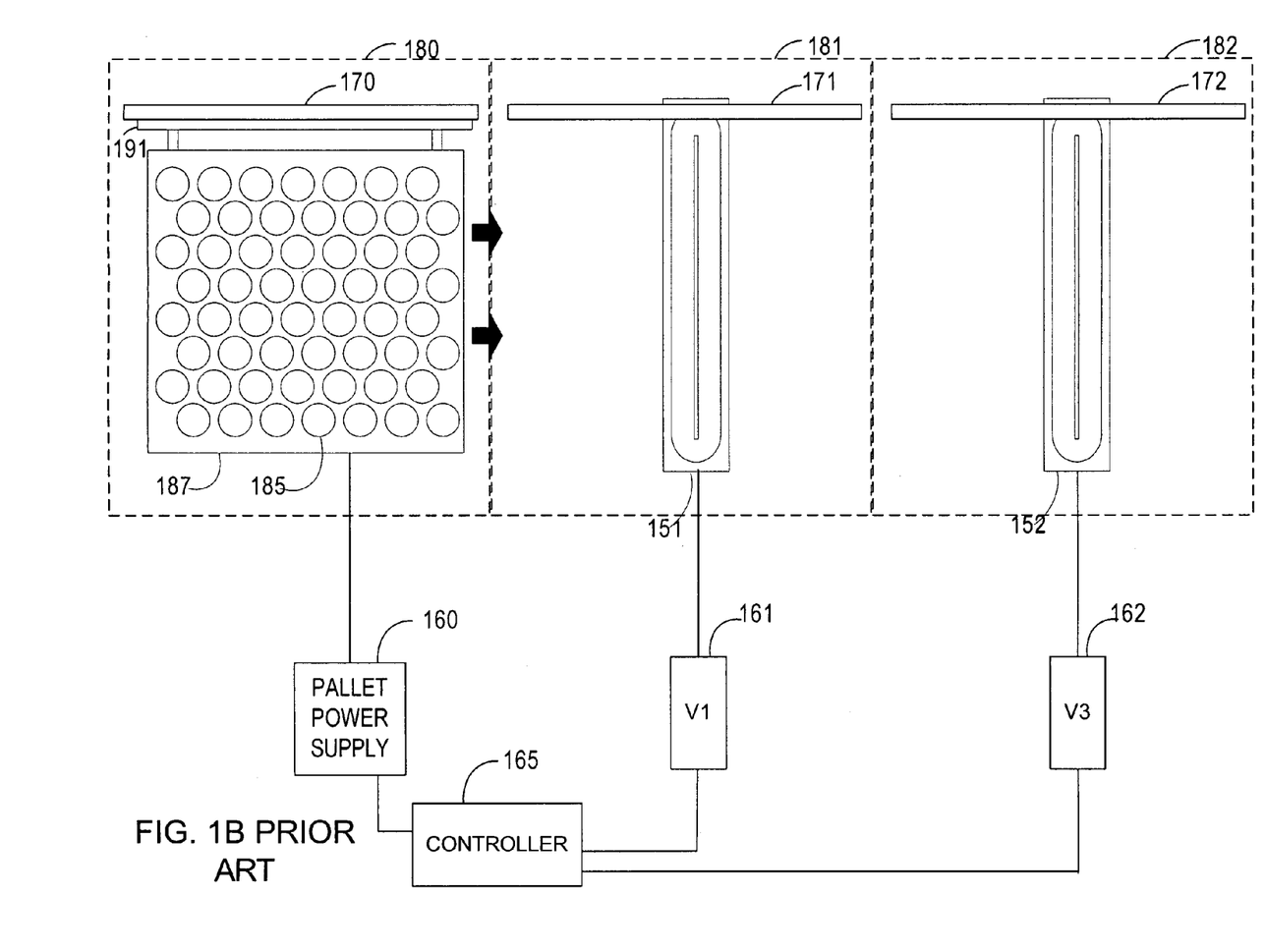
FIG. 1B is a block diagram showing the prior art in-line sputtering tool using pallets to carry disks used for making magnetic media.

FIG. 1B is an illustration showing a front view of one side of a conventional magnetron sputtering system used to sputter deposit layers of the magnetic media. FIG. 1B shows a first target-cathode 151, a second target-cathode 152, both with erosion zones and redeposition areas, a first transport 170 located within a first vacuum chamber 180, a second transport 171 located within a second vacuum chamber 181, and a third transport 172 located within a third vacuum chamber 182. FIG. 1B also shows substrates 185, a pallet 187 a beam 191, a pallet bias power supply 160, a first power supplies 161, a second power supply 162, and a controller 165. First vacuum chamber 180 is a conventional chamber, typically made of stainless steel that acts as a buffer before and houses the pallet 187 before transporting it into the second vacuum chamber 182 where it is coated with material from target-cathode 151. Second vacuum chamber 181, and third vacuum chamber 181 are also conventional chambers, typically made of stainless steel that house first target-cathode 151 and second target-cathode 152, respectively, as well as transports 171 and 172. Pallet 187 is typically made of aluminum and is machined to hold substrates 185 in an upward position and in an array. Beam 191 is typically a stainless steel beam from which pallet 187 hangs and is transported in vacuum chamber 180. First target-cathode 151 and second target-cathode 152 include both the target material to be sputtered, the cathode for applying a voltage to the target material, appropriate electrical connections, and cooling mechanism if needed.

In FIG. 1B the target-cathodes are spaced apart so that first target-cathode 151 can be set at first voltage, second target-cathode 152 can be set at a second voltage, and pallet 187 can have a bias voltage set at different bias voltage levels for each of the target-cathodes. Pallet 187 is biased at a first bias voltage using the voltage bias power supply 160 and then transported in front of first target-cathode 151, which is set to voltage V1. Before the bias voltage can be set to a different level, pallet 187 must be transported completely passed first target-cathode 151. Once the pallet 187 is moved passed first target-cathodes 151, the new and different bias voltage levels is set and the pallet is moved passed the second target-cathode 152, which is set to voltage level V2. The pallet 187 must be moved completely passed first target-cathode 151 before the bias voltage can be changed because all of the substrates on the pallet are at the same bias voltage. Although using pallets to process multiple substrates is very efficient, there are disadvantages such as maintaining all substrates at the same process condition. For example, all the discs on the same pallet are set to the same bias voltage, although it may be advantageous to have different parts of a pallet set at different bias voltages. This conventional means of applying different voltages is disadvantages because the pallet must be moved completely out passed the first target-cathode 151 before the bias voltage on the pallet can be changed. This translates to bigger sputtering systems that are more expensive to build and maintain.

In many applications it is advantageous to deposit different materials onto substrates that are biased at different voltages. Adjusting the substrate bias voltage according to the material being deposited optimizes thin film deposition processes. Since deposition processes are often optimized by adjusting the substrate bias voltage depending on the material to be deposited and all of the substrates on a pallet must be biased to the same voltage level, the target-cathodes for depositing one material have to be separated from the target-cathodes for depositing a different material by at least the length of the pallet used.

These disadvantages become significant problems when depositing films in a manufacturing environment where throughput, costs, and floor space are major considerations. These problems are particularly important in the manufacture of disc drives because of the complexity of the magnetic media and the requirement that it be made inexpensively. The restriction of having to place target-cathodes far apart when using pass-by sputter tools significantly impacts the practicality of making magnetic media with pass-by sputter tools because complex magnetic media structures, as described with reference to FIG. 1, contain multiple layers that are often processed with different substrate bias voltages. Similar limitations exist on the use of pass-by sputter tools, as well as similar tools, in all industries that require depositing multiple layers on many substrates.

Therefore what is needed is a system and method that allows for variable biasing of a pallet loaded with discs, so that sputtering cathodes requiring different pallet biasing, do not have to be separated by at least the length of the pallet.

SUMMARY OF THE INVENTION

The invention provides a system and method for applying variable voltages to a substrate holder holding a substrate, a target-cathode being sputtered and a shield positioned around the target cathode. Additionally, the substrate holder can be a pallet holding a plurality of disks and there can be more than one target-cathode and more than one shield positioned adjacent to each other as in an in-line sputtering system. One advantage of such a system is that target-cathodes being sputtered and requiring different pallet bias voltages do not have to be separated by at least the length of a pallet. This permits the use of high throughput sputtering tools for depositing complex multi-layers.

One embodiment of the invention includes a sputter system having a pallet moveable along a path of travel and capable of being subject to a plurality of different pallet bias voltages, a plurality of target-cathodes that can be powered at different target-cathode voltages disposed along the path of travel, a plurality of shields positioned around the target-cathodes that be subject to a plurality of different shield voltages, and a controller configured to selectively vary the target-cathode voltage, the shield voltage and the pallet bias voltage, while the pallet moves along the path of travel. The target-cathodes and shields, which can be located along the path of travel and/or can be on both sides of the path of travel, are spaced apart by a distance less than the length of the pallet. The controller can include a timing circuit for synchronizing changes in the target-cathode voltages and shield voltages with changes in the pallet bias voltage.

Another aspect of the invention is a method of sputtering layers of materials onto substrates carried by a pallet that includes moving the pallet along a path of travel, applying a variable pallet bias voltage to the pallet, applying different target-cathode voltages to different target-cathodes for sputtering different materials, applying different shield voltages to different shields, and selectively varying the target-cathodes voltages, shield voltages, and the pallet bias voltage while the pallet is moving and in front of the target-cathodes. This method also includes selectively varying each of the target-cathodes voltages, shield voltages and pallet bias voltages according to a predetermined sequence saved in a schedule.

A magnetic recording medium made by this sputter system and method is also disclosed. The magnetic recording medium made in accordance with the system and method disclosed includes a substrate for depositing layers thereon, a seed layer sputter deposited onto the substrate for defining the growth of subsequent layers, a magnetic layer sputter deposited onto the seed layer, and a protective overcoat sputter deposited onto the magnetic layer for protecting the magnetic layer. At least one of the sputter deposition processes used to make the magnetic recording medium is done by applying a variable pallet bias voltage to the pallet, applying different voltages to the different target-cathodes for sputtering different materials, applying different shield voltages to the shields and selectively varying the target-cathodes voltages, shield voltages and the pallet bias voltage while the pallet is moving and is in front of the different target-cathodes.

A disc drive for recording and retrieving data using the magnetic recording medium made in accordance with this invention is also disclosed in this invention.

BRIEF DESCRIPTION OF THE INVENTION

DETAILED DESCRIPTION OF THE PREFERRED EMBODIMENTS

The invention provides a system and method for making a multilayer thin film structure using sputtering techniques. The system provides a way to deposit multilayers in a high throughput sputtering tool that carries many substrates on a pallet by giving the flexibility to independently control sputtering conditions of closely packed targets made of different materials. The inventive system enables applying variable voltages to a substrate holder or pallet holding one or more substrates, a target-cathode being sputtered and a shield positioned around the target cathode while the substrate holder (or pallet) moves through the sputtering tool. The invention also includes a method of sputtering layers of materials onto substrates carried by a pallet that includes moving the pallet along a path of travel, applying a variable pallet bias voltage to the pallet, applying different target-cathode voltages to different target-cathodes for sputtering different materials, applying different shield voltages to different shields, and selectively varying the target-cathodes voltages, shield voltages, and the pallet bias voltage while the pallet is moving and in front of the target-cathodes. This method also includes selectively varying each of the target-cathodes voltages, shield voltages and pallet bias voltages according to a predetermined sequence saved in a schedule.

Figure 2:
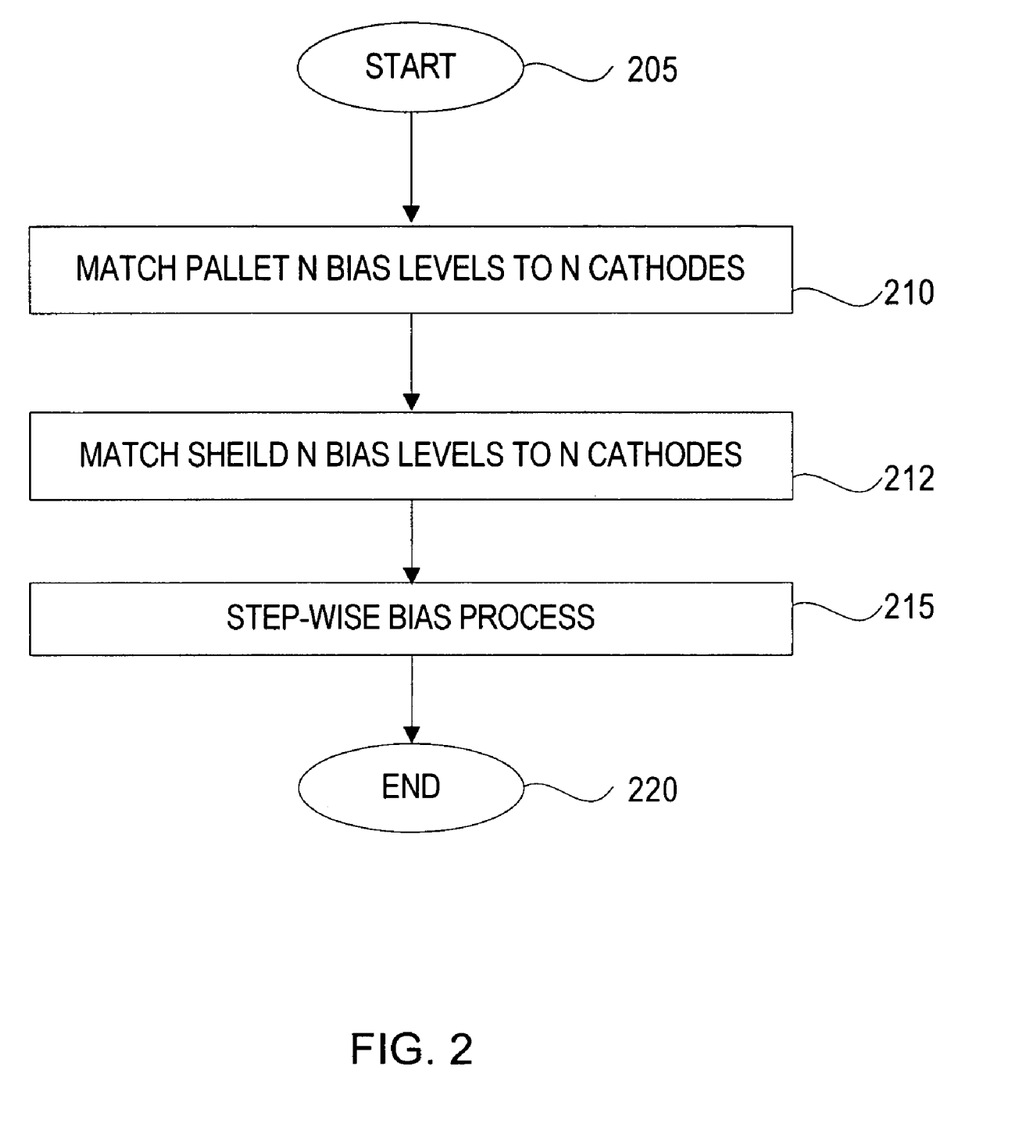
FIG. 2 is a flowchart illustrating a method of making magnetic media in accordance with one embodiment of the invention.

FIG. 2 is a flowchart illustrating a method of making magnetic media using a pallet for transporting multiple substrates that can be biased to different voltage levels in accordance with one embodiment of the invention. In step 205 the pallet containing substrates is started in motion in the pass-by sputter system toward the target-cathodes preparing it for sputter depositing films in the sputtering chamber having multiple bias voltage levels by moving it into position. Next in step 210 the desired pallet bias voltage levels are matched to each target-cathode generating a schedule that matches pallet bias voltage level, target-cathode number, target-cathode voltage, and time each one should be turned on and off. The schedule can be a table listing when all of these components are turned on and off and to which levels they are set. If the sputtering process uses N number of target-cathodes with N shields each having a different voltage applied then the pallet bias voltage level is matched to each target-cathode so that when the a specific target-cathode is activated the corresponding correct pallet bias level is also activated. Similarly in the next step 212, the desired shield voltage levels are matched to each target-cathode generating a schedule that matches shield voltage level, target-cathode number, target-cathode voltage, and time each one should be turned on and off. The schedule can be a new table, or preferably can be amended to the previously generated table for the pallet bias voltage table, which lists when all of these components are turned on and off and to which levels they are set. If the sputtering process uses N number of target-cathodes with N shields each having a different voltage applied then the shield voltage level is matched to each target-cathode so that when the a specific target-cathode is activated the corresponding correct shield voltage is also activated.

Next in step 215 the step-wise bias process is performed allowing for the application of variable pallet bias voltages to the pallet loaded with substrates and the application of the variable shield voltages to the different shields, as is further discussed with reference to FIG. 3 below. This step allows each layer deposited on the substrate to be sputtered deposited under different conditions such as different pallet bias voltages, different shield voltages and different target-cathode voltages in order to optimize microstructure for the material. Finally in step 220 the process ends when the substrates are completely coated and the target-cathodes are turned off. In a typical pass-by sputter system the pallet is usually moved out of the sputtering chamber at step 220.

Figure 3:
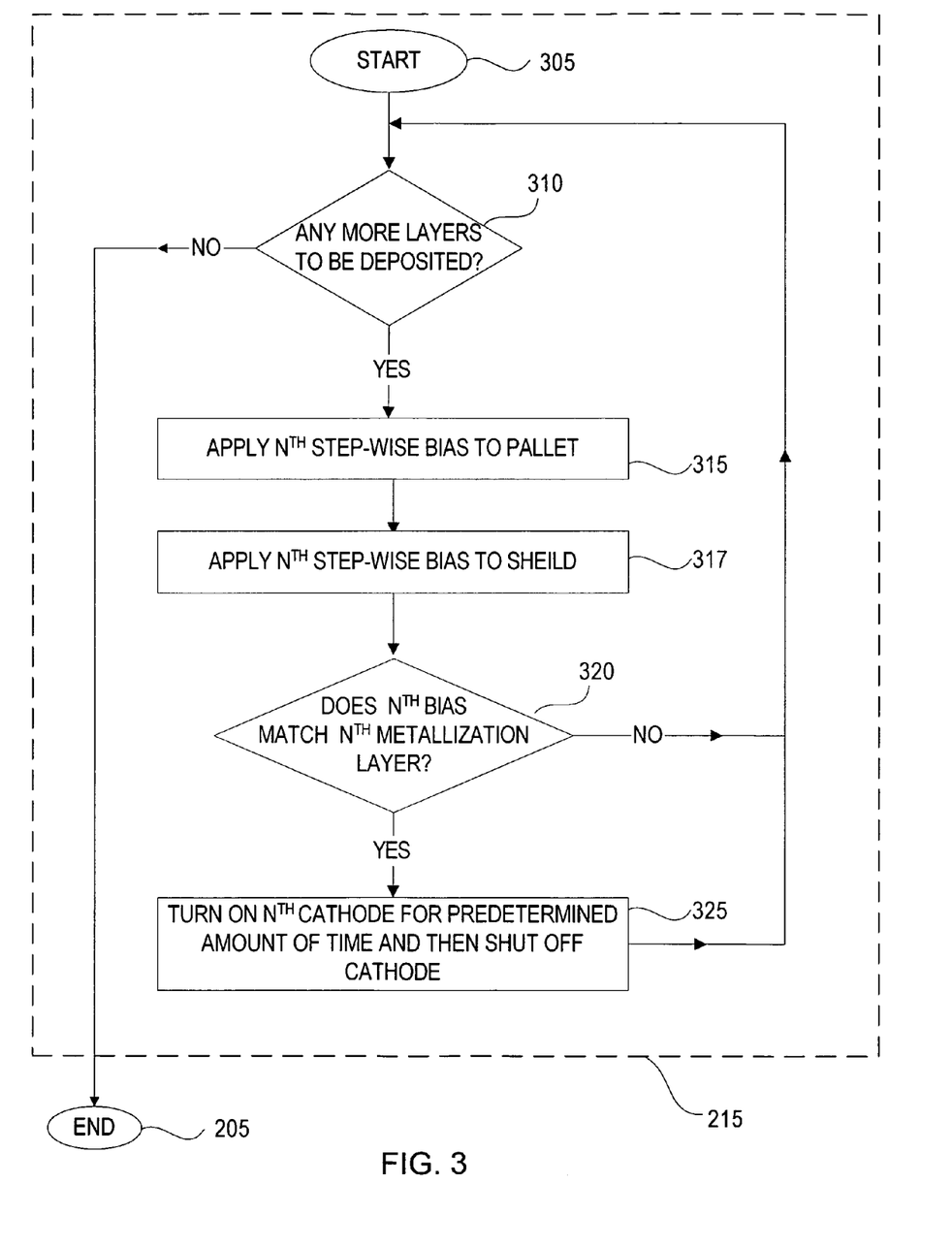
FIG. 3 is a flowchart showing details of step 215 in the flowchart of FIG. 2.

FIG. 3 is a flowchart showing details of step 215 in the flowchart of FIG. 2. First in step 305, the pallet and loaded substrates move toward the deposition chamber. Next in step 310 a decision is made as to whether any more layers will be deposited onto the substrate. If the decision is YES then the correct pallet bias voltage is set in step 315 and if the decision is NO then the process moves to step 205 where it ends. Next in step 315 the desired pallet bias voltage level is applied to the pallet. The pallet bias voltage applied to the pallet is determined in accordance to the schedule generated in step 210. Next in step 317 the desired shield voltage level is applied to the shield. As in step 315, the shield voltage applied to the shield is determined in accordance to the schedule generated in step 210. Next in step 320 a check is done to confirm that the pallet bias voltage and the shield voltage levels being applied match the predetermined desired levels for the giving layer to be deposited according to the schedule generated in step 210. Step 320 is optional and is done only as a precaution. The process can progress to the next step 325 without completing step 320 because the time required to perform step 320 may affect throughput. In such a situation an error can be recorded if the correct voltage values are not reached.

Next in step 325 the $N^{th}$ target-cathode is turned on, set to the desired voltage according to the schedule generated in step 210, and left on at that voltage for a predetermined amount of time. All of this is done while the pallet is moving with a pallet bias voltage on it and the shield is set to a shield voltage. After the predetermined time lapses, the target-cathode is shut off and the process goes back to step 310 where another decision is made as to whether any more bias levels are needed. In order for step 215 to work properly the pallet bias voltages and the shield voltages need to be switched quickly. This is accomplish by using power supplies having a repetition rate high enough that the pallet does not move a significant amount during the target-cathode off-time as is further discussed with reference to FIG. 4 below.

Figure 4:
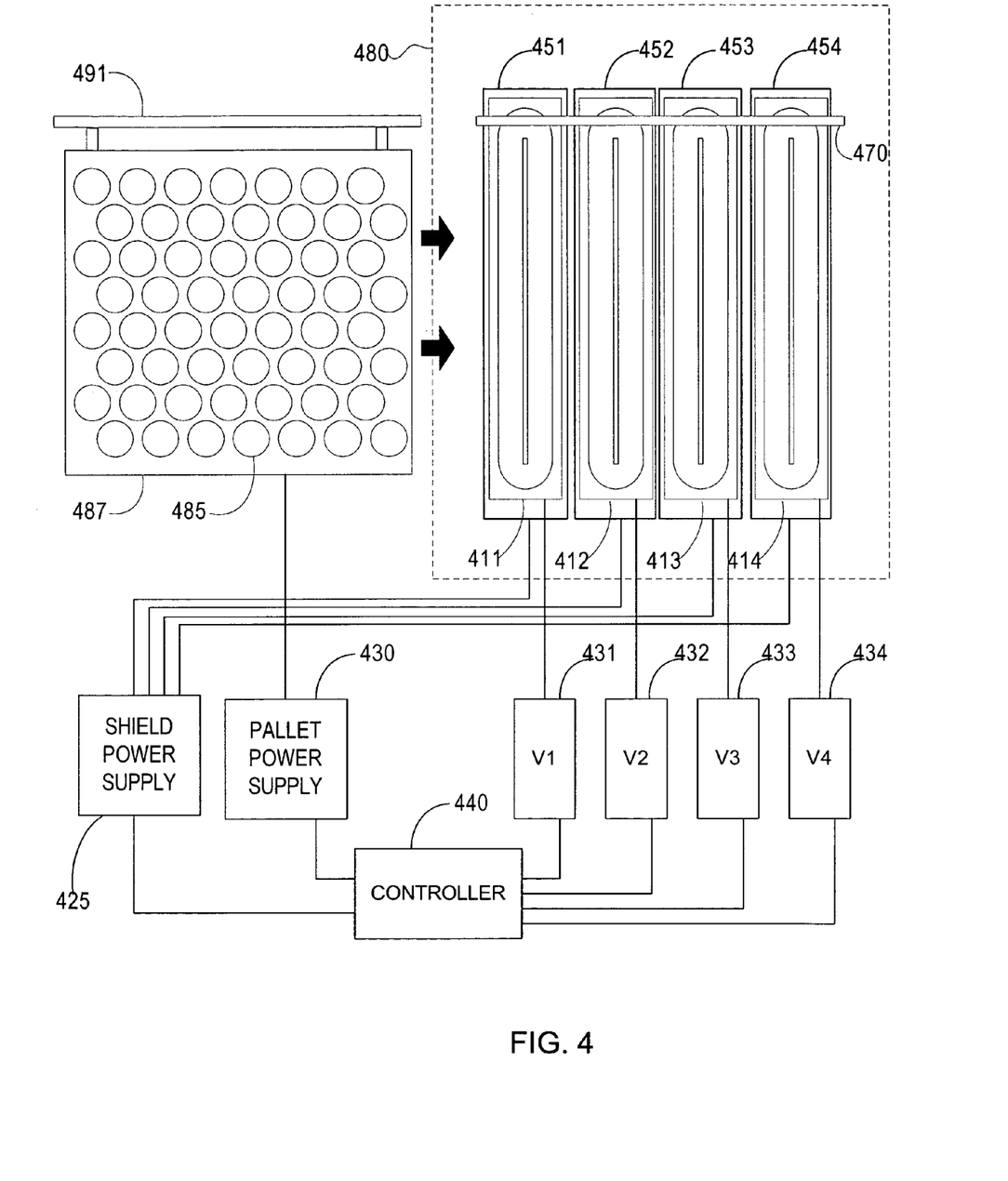
FIG. 4 is a block diagram illustrating an apparatus for carrying out the steps described with reference to FIGS. 2 and 3 in accordance with one embodiment of the invention.

FIG. 4 is a block diagram illustrating an apparatus for carrying out the steps described with reference to FIGS. 2 and 3 in accordance with one embodiment of the invention. FIG. 4 includes a first target-cathode 411, a second target-cathode 412, a third target-cathode 413, a fourth target-cathode 414, a shield power supply 425, a pallet power supply 430, a first target-cathode power supply (V1) 431, a second target-cathode power supply (V2) 432, a third target-cathode power supply (V3) 433, a fourth target-cathode power supply (V4) 434, a controller 440, a first shield 451, a second shield 452, a third shield 453, a fourth shield 454, a transport 470 located within a vacuum chamber 480, a plurality of substrates 485, a pallet 487, a beam 491. The target-cathodes 411-414 are all shown with erosion zones and redeposition areas. Additionally the first shield 451, the second shield 452, the third shield 453 and the fourth shield 454 are shown surrounding the first target-cathode 411, the second target-cathode 412 the third target-cathode 413, and the fourth target-cathode 414, respectively.

Vacuum chamber 480 is a conventional chamber, typically made of stainless steel which houses the first target-cathode 411, second target-cathode 412, third target-cathode 413, fourth target-cathode 414, the first shield 451, the second shield 452, the third shield 453, the fourth shield 454 and transport 470. Unlike the prior art described with reference to FIG. 1B the target-cathodes do not have to be spaced one pallet length apart. The invention permits the same process to be run on these closely spaced target-cathodes as was run on the system with separated target-cathodes shown in FIG. 1B. Pallet 487 is typically made of aluminum and is machined to hold substrates 485 in an array and in an upward position. The pallet 487 is designed to support the substrates by their edges so that both major surfaces of each substrate are exposed during sputtering. Beam 491 is typically a stainless steel beam used to transport pallet 487 in and through vacuum chamber 480. Pallet 487 hangs from beam 491.

The pallet power supply 430 is coupled to the pallet 487 and can have a repetition rate that is high enough so that the pallet 487 does not move a significant amount during the target-cathode off-time. However, the high repetition rate is not required and the system can be made to operate with a pallet power supply 430 having a lower repetition rate. If the pallet power supply 430 has a low repetition rate then this process will be run by holding the pallet voltage constant and only varying the voltages of first shield 451, second shield 452, third shield 453, and fourth shield 454. The pallet power supply, capable of supplying high voltages ranging up to thousands of volts with either positive or negative polarity, helps achieve film thickness uniformity across the substrates in the direction of travel. The first target-cathode power supply (V1) 431 is used to provide power to the first target-cathode 411 and can be an RF power supply, a DC power supply, or an AC power supply. Other types of power supplies having appropriate repetition rates can be used for this application as well. Similarly, the second target-cathode power supply (V2) 432, third target-cathode power supply (V3) 433, and fourth target-cathode power supply (V4) 434 are used to supply power to target-cathodes 412, 413, and 414 respectively. Shield power supply 425 is coupled to the four shields 451-454 and should also have a repetition rate that is high enough so that the pallet 487 does not move a significant amount during the target-cathode off-time. Similarly, the high repetition rate is not required and the system can be made to operate with a shield power supply 425 having a lower repetition rate. The shield power supply, which is capable of supplying high voltages ranging up to thousands of volts with either positive or negative polarity, helps achieve film properties and thickness uniformity across the substrate. Additionally, shield power supply 425 is configured to supply an independent voltage to each of the four shields 451-454. In an alternative embodiment shield power supply 425 can be replaced with four separate power supplies that each supply power to the shields and are controlled through a controller.

Controller 440 can be a programmable logic controller (PLC) containing a timing circuit. The PLC is used to generate a schedule for synchronizing the pallet bias voltages, shield voltages, and target-cathode power. Controller 440 is also used to set pallet bias voltages and shield voltages, turn target-cathodes on and off, select target-cathode powers and keep track of time.

According to one embodiment of the present invention, there are multiple pairs of target-cathodes, each pair being characterized by an optimal voltage $V_1, V_2, \ldots, V_n$ respectively that is recorded in a schedule. Surrounding each target-cathode there is a shield which can be subjected to a voltage $VS_1, VS_2, \ldots, VS_n$ respectively that further optimizes the film structure. A circuit found in controller 440 is provided to synchronize voltage levels of the target-cathodes and bias voltages. Preferably, the changes in the target-cathode voltage, the shield voltage and the pallet bias voltage are initiated or controlled by a timing circuit.

The rate of travel of the pallet is generally dependent on the equipment used and the nature of the manufacturing process. While the rate of travel may be set as fast as is desirable within equipment confines, it should preferably be slow enough with respect to the switching time of the power supplies. The slower rate of travel helps achieve better thickness uniformity of deposited films across the substrates in the direction of travel of the pallet and is therefore preferable.

Comparing FIG. 4 with the prior art FIG. 1B, the advantages of placing the target-cathodes closer to each other, in accordance with one embodiment of the invention, are illustrated. In this embodiment of the invention, there is no need to space the target-cathodes apart from each other by at least the length of the pallet. Doing away with this minimum spacing requirement significantly reduces the size required of the processing tool for the same number of target-cathodes used, and also facilitates the manufacture of multi-layer structures.

In an alternative embodiment the pallet bias voltage can be eliminated and the process controlled with just the use of the target-cathode power supplies and the shield power supplies. The advantages of using the pallet bias voltage are to add flexibility to the process and more functionality. However, the film properties and uniformities can be controlled through the use of the shield power supply and target-cathode power supplies.

Figure 5A:
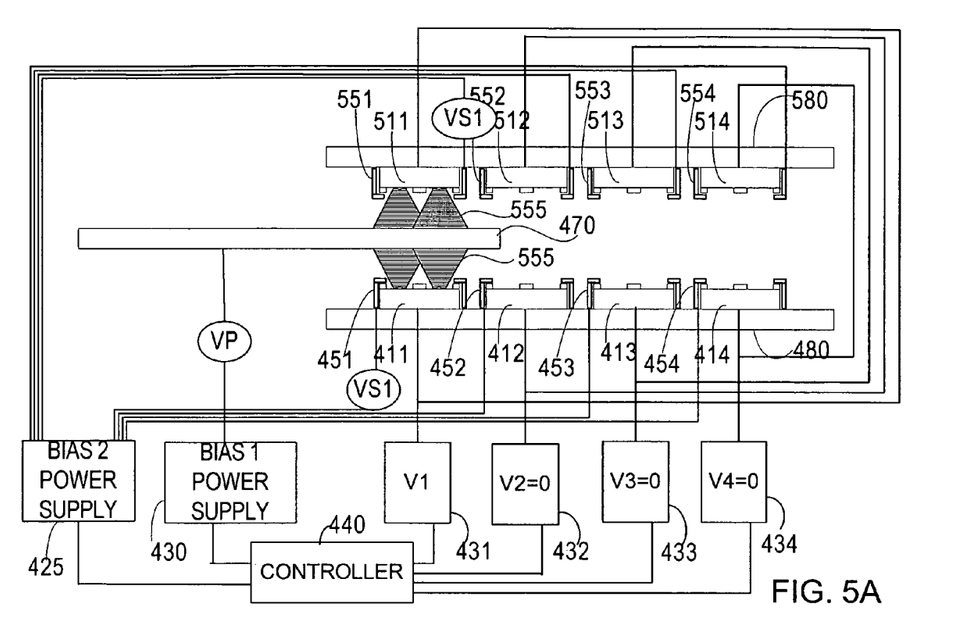
FIG. 5A is a block diagram showing a top view of the FIG. 4 apparatus in the first step of a multi-layer deposition process applying the first step of the four-layer deposition process.
Figure 5B:
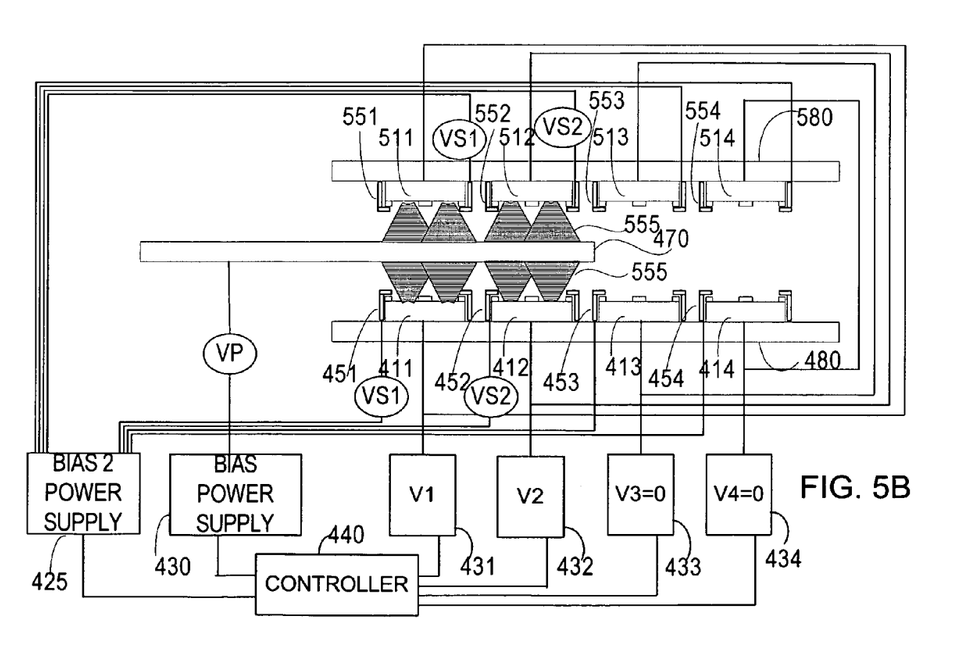
FIG. 5B is a block diagram showing a top view of the FIG. 4 apparatus in the second step of a multi-layer deposition process applying the second step of the four-layer deposition process.
Figure 5C:
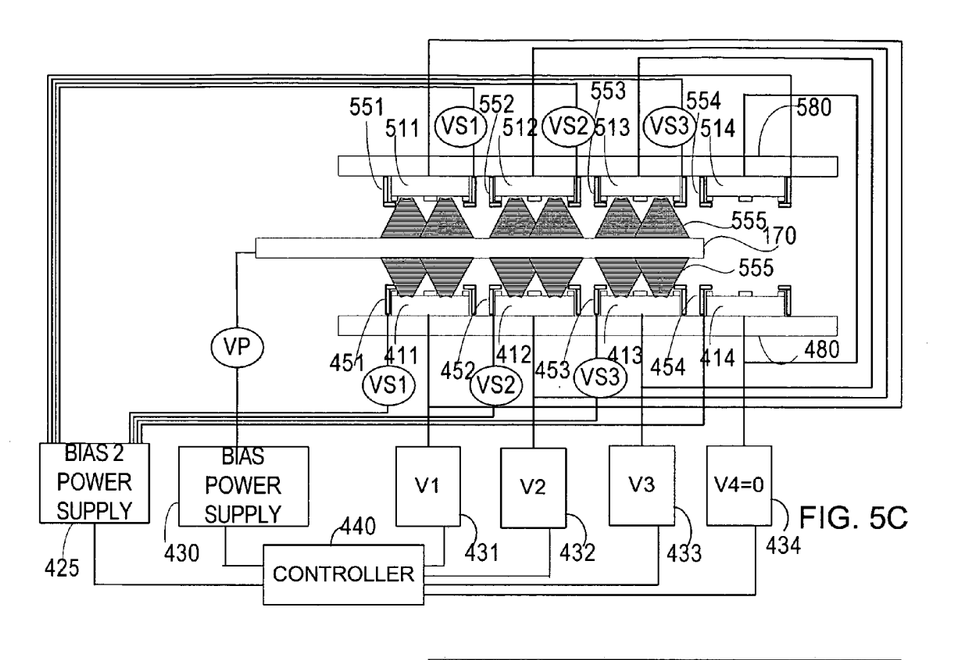
FIG. 5C is a block diagram showing a top view of the FIG. 4 apparatus in the third step of a multi-layer deposition process applying the third step of the four-layer deposition process.
Figure 5D:
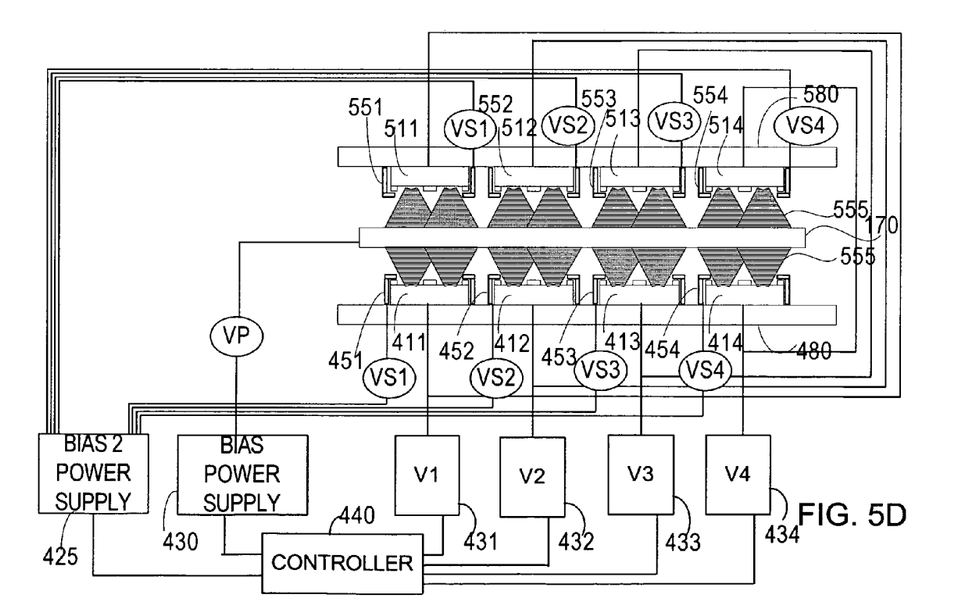
FIG. 5D is a block diagram showing a top view of the FIG. 4 apparatus in the four step of a multi-layer deposition process applying the four step of the four-layer deposition process.

FIG. 5A-5D are block diagrams showing detailed top views of the apparatus in FIG. 4 at different stages of a four-layer deposition process. FIG. 5A-5D show an additional four target-cathodes with shields positioned on the opposite side of the direction of travel of the pallet. Fifth target-cathode 511 is positioned opposite first target cathode 411, sixth target-cathode 512 is positioned opposite second target cathode 412, seventh target-cathode 513 is positioned opposite third target cathode 413, and eighth target-cathode 514 is positioned opposite fourth target cathode 414. Fifth shield 551 is positioned opposite first shield 451, sixth shield 552 is positioned opposite second shield 452, seventh shield 553 is positioned opposite third shield 453, and eighth shield 554 is positioned opposite fourth shield 454. FIG. 5A shows the process in the first step of the four-layer deposition process. FIG. 5B shows the process in the second step of the four-layer deposition process. FIG. 5C shows the third step of the four-layer deposition process. FIG. 5D shows the fourth step of the four-layer deposition process.

In FIG. 5A, the pallet bias voltage is set at VP, the first shield 451 and the fifth shield 551 are set to voltage VS1, the first target-cathodes 411 and fifth target-cathode 511 are both set to a voltage of V1 causing plasma 555 to ignite while the remaining target-cathodes are off. Pallet 487 is subjected to the bias voltage VP and moves from left to right passing in front of the plasma 555 getting a film deposited on it. The pallet bias voltage VP can be applied on pallet 487 through a bias rail or other means as is well known in the art. The pallet 487 moves in the direction of the arrow shown in FIG. 4 or from left to right by being driven with a transport 470. Both first target-cathodes 411 and fifth target-cathode 511 are maintained at voltage V1 for a predetermined fixed amount of time in accordance with the schedule discussed with reference to FIG. 2 above. Similarly, both first shield 451 and fifth shield 551 are maintained at voltage VS1 for a predetermined fixed amount of time also in accordance with the schedule discussed with reference to FIG. 2 above. In an alternative embodiment a sensor can be used to locate the position of the pallet 487 and set all the voltages according to where the pallet is located. In this alternative embodiment the schedule would have pallet position as one of its entries.

FIG. 5B is a block diagram showing a top view of the FIG. 4 apparatus during the second step of the four-layer deposition process. In this step the second target-cathode 412 and sixth target-cathode 512 are both set to a voltage of V2, while maintaining the voltage discussed and set in FIG. 5A, causing plasma 555 to ignite in front of target-cathodes 412 and 512. Target-cathodes 413, 414, 513 and 514 are left off according to the schedule defined with reference to FIG. 2 above. Similarly, both second shield 452 and sixth shield 552 are maintained at voltage VS2, while first shield 451 and second shield 452 remain at VS1, for a predetermined fixed amount of time also in accordance with the schedule discussed with reference to FIG. 2 above. After a timer indicates that a predetermined amount of time has elapsed, this step begins by turning on the second target-cathode power supply 432 and setting it to voltage V2. This switching process is done quickly so that the amount of distance the pallet 487 travels during the switching process is small. Usually, the switching time takes between 10 milliseconds and 20 milliseconds and since the pallet travels about 20 feet per second, the distance the pallet has moved during the transition is very small.

FIG. 5C is a block diagram showing a top view of the FIG. 4 apparatus during the third step of the four-layer deposition process. In this step the pallet bias voltage is left at VP, the third shield 453 and the seventh shield 553 are set to a voltage of VS3, the third target-cathode power supply 433 is set to voltage V3, and the remainder of the target-cathode voltages are left unchanged according to the schedule defined with reference to FIG. 2 above. The switch to this configuration from the configuration described with reference to FIG. 5B occurs as described above.

FIG. 5D is a block diagram showing a top view of the FIG. 4 apparatus during the fourth step of the four-layer deposition process. In this step the pallet bias voltage is left at VP, the fourth shield 454 and eighth shield 554 are set to a voltage of VS4, fourth target-cathode power supply 434 is set to voltage V4, and the remainder of the target-cathode voltages are left unchanged according to the schedule defined with reference to FIG. 2 above. The switch to this configuration from the configuration described with reference to FIG. 5C occurs as described above.

In an alternative embodiment, all of the target-cathode power supplies 431, 432, 433 and 444 are ON and set to V1, V2, V3, and V4 respectively at the beginning of the process depicted in FIG. 5A. Similarly, first shield 451 and fifth shield 551 are set to VS1, second shield 452 and sixth shield 552 are set to VS2, third shield 453 and seventh shield 553 are set to VS3, fourth shield 454 and eighth shield 554 are set to VS4 at the beginning of the process. Additionally the voltage on the pallet is set at one value VP which remains at that value through the entire process depicted in FIGS. 5A-5D. In a different embodiment the voltage on the pallet can be varied as it moves through the chamber.

Figure 6:
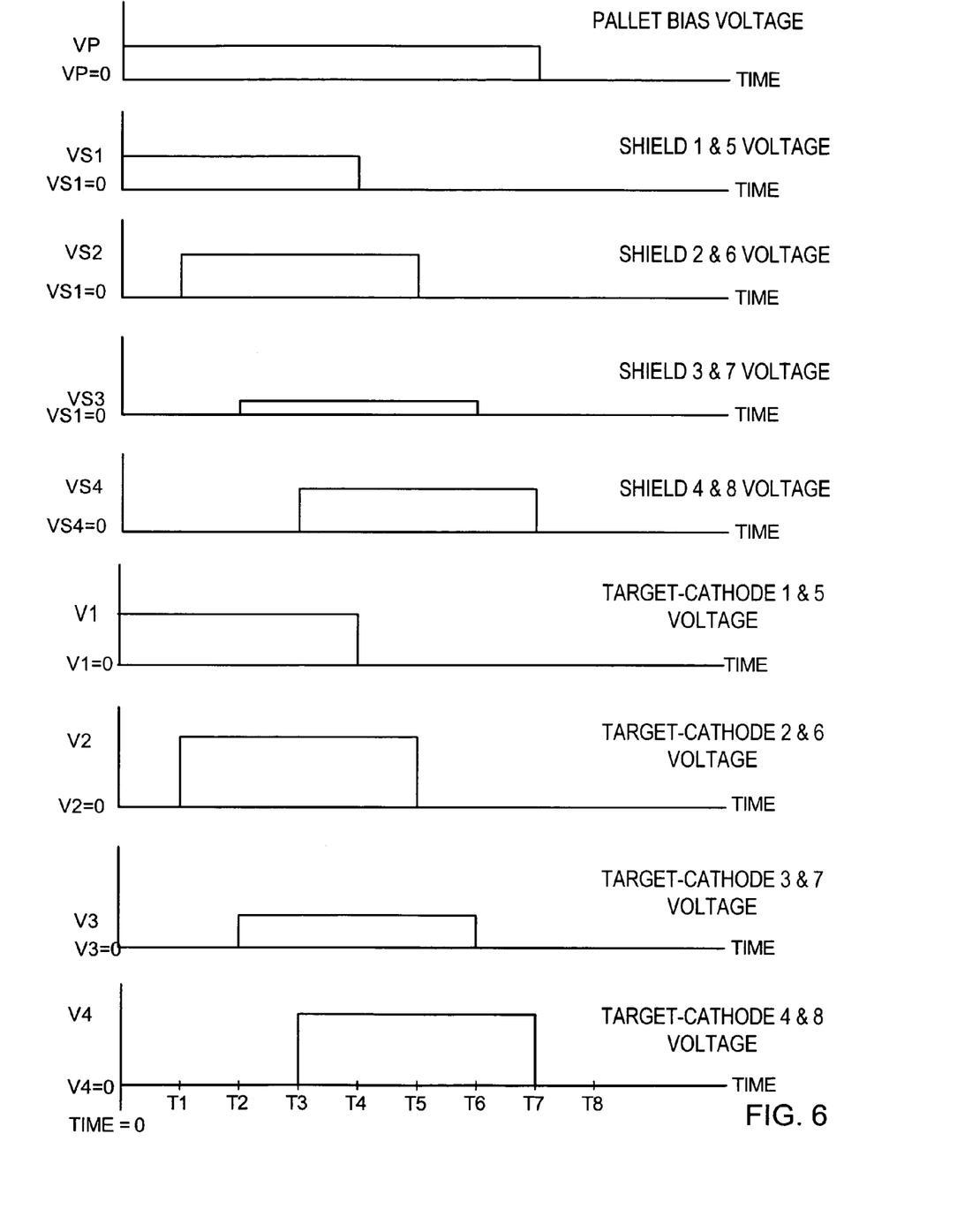
FIG. 6 is a chart showing the voltage profile occurring in the method of making magnetic media in a four-step multi-layer deposition process.

FIG. 6 is a chart showing the voltage profile occurring in the method of making magnetic media in accordance with one embodiment of the invention. This voltage profile is used in a process that minimizes cross sputtering onto targets because the target-cathode voltages as well as shield voltages are only at high power when the pallet is in front of them. For example, as seen in FIG. 6 first target cathode 411 and fifth target cathode 511 as well as first shield 451 and fifth shield 551 are both turned ON and set to high voltage as well as shut OFF before second target-cathode 412, sixth target-cathode 512, second shield 452 and sixth shield 552. The voltage profile of FIG. 5A is represented by the time in the range from 0 to T1 when the pallet bias voltage is set at VP, the first shield 451 and fifth shield 551 voltages are set at VS1, first target-cathode 411 voltage and the fifth target-cathode 511 voltages are set at V1, while the remaining target-cathodes 412-414 and 512-514 are set at zero and the remaining shields 452-454 and 552-554 voltages are set at zero.

The voltage profile of FIG. 5B is represented by the time in the range from T1 to T2 when the pallet bias voltage is set at VP, the second shield 452 and sixth shield 552 voltages are set at VS2, second target-cathode 412 voltage and the sixth target-cathode 512 voltages are set at V2, while the remaining target-cathodes 411, 413, 414, 511, 513, and 514 voltages remain the same and the remaining shields 451, 453, 454, 551, 553, and 554 voltages also remain the same.

The voltage profile of FIG. 5C is represented by the time in the range from T2 to T3 when the pallet bias voltage is set at VP, the third shield 453 and seventh shield 553 voltages are set at VS3, third target-cathode 413 voltage and the seventh target-cathode 513 voltages are set at V3, while the remaining target-cathodes 411, 412, 414, 511, 512, and 514 voltages remain the same and the remaining shields 451, 452, 454, 551, 552, and 554 voltages also remain the same.

The voltage profile of FIG. 5D is represented by the time in the range from T3 to T4 when the pallet bias voltage is set at VP, the fourth shield 454 and eighth shield 554 voltages are set at VS4, fourth target-cathode 414 voltage and the eighth target-cathode 514 voltages are set at V4, while the remaining target-cathodes 411, 412, 413, 511, 512, and 513 voltages remain the sane and the remaining shields 451, 452, 453, 551, 552, and 553 voltages also remain the same. At time T4 the pallet 487 has cleared first target-cathode 411, fifth target-cathode 511, first shield 451, and fifth shield 551, so that the voltages on all of these can be set to zero. This is done to prevent cross sputtering onto the target surfaces when the pallet and disks is not in front of the target-cathodes. This same routine is repeated for the next three times T5, T6 and T7. All voltage values are set in accordance with a recipe detailed on a schedule. In another embodiment of the invention the all the target-cathode voltages and all of the shield voltages are set to a one value for the entire cycle depicted from T0 through T7.

Figure 7:
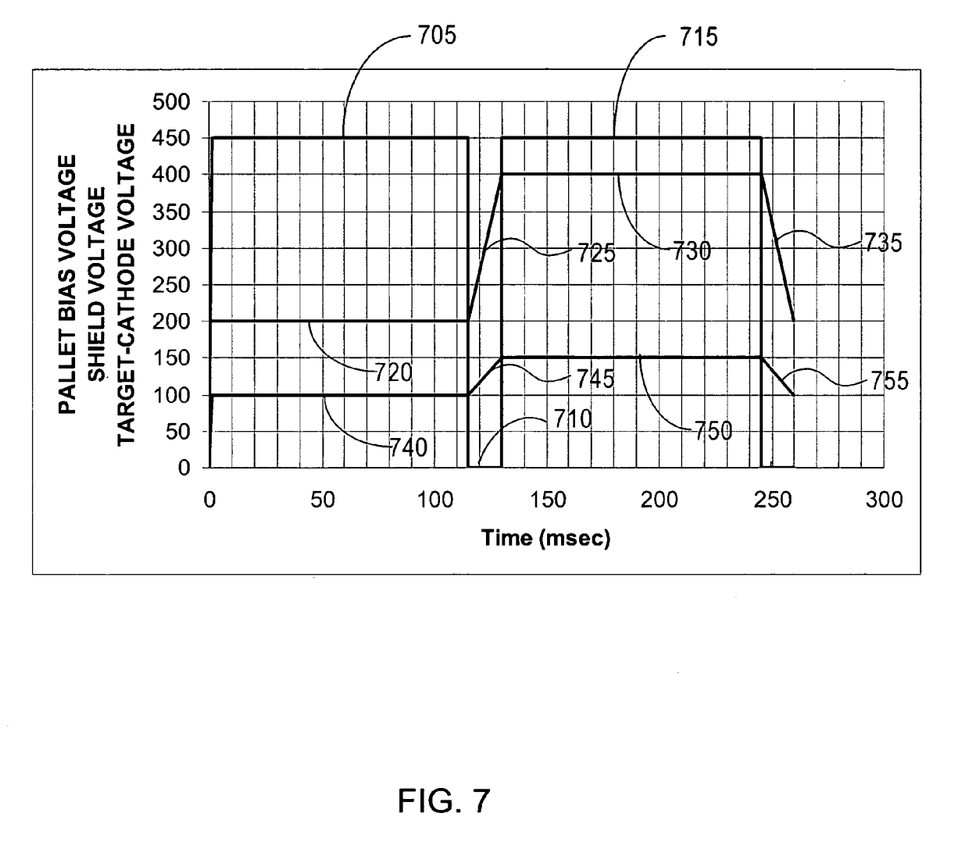
FIG. 7 is a detailed plot of pallet bias voltage vs. time and a shield voltage vs. time showing details of the transition between different pallet bias voltages and shield voltages.

FIG. 7 is a plot of bias voltage vs. time showing details of the transition between different bias voltages for an embodiment having a single pallet bias voltage step and a single shield voltage step. Curve 705 represents a voltage on the first target-cathode 411, curve 710 represents the transition between the first target-cathode 411 and the second target-cathode 412, curve 715 represents a voltage on the second target-cathode 412, curve 720 represents a first pallet bias voltage on the pallet 487, curve 725 represents a first transition pallet bias voltage on the pallet 487, curve 730 represents a second pallet bias voltage 730, curve 735 represents a second transition pallet bias voltage on the pallet 487, curve 740 represents a first shield voltage on the first shield 451, curve 745 represents a first transition shield voltage from first shield 451 to second shield 452, curve 750 represents a second shield 452 voltage, and curve 755 represents a second transition shield voltage on the second shield 452.

FIG. 7 shows the first target-cathode 411 is on and powered to 450 volts for 115 milli-seconds, and then shut off for 15 milli-seconds and the second target-cathode 412 turned on and powered to 450 volts for another 115 milli-seconds. FIG. 7 also shows the pallet bias voltage set at 200 volts for the first 115 milli-seconds while the first target-cathode is on, the pallet bias voltage transition from 200 volts to 400 volts in 15 milli-seconds, the pallet bias voltage remaining at 400 volts for the first 115 milli-seconds while the second target-cathode is on, and finally the pallet bias voltage transitions back to 200 volts in 15 milli-seconds. FIG. 7 also shows the first shield 451 voltage set at 100 volts for the first 115 milli-seconds while the first target-cathode 411 is on, the first shield 451 voltage transition from 100 volts to zero and the second shield 452 voltage turn on and transition to 150 volts in 15 milli-seconds while the target-cathodes transition, the second shield 452 voltage remaining at 150 volts for the first 115 milli-seconds while the second target-cathode 412 is on, and finally the second shield 452 voltage transitions back to 100 volts in 15 milli-seconds. Additionally, FIG. 7 shows both target-cathodes operating at 46% duty cycle with each target-cathode firing at 2.2 times normal power for 115 milli-seconds.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A sputter system, comprising:
a substrate holder configured to hold a substrate;
a plurality of target-cathodes having a plurality of shields, said target-cathodes configured to be biased to a target-cathode voltage and said shields configured to be biased to a shield voltage wherein said shields are positioned in between said target-cathodes that are adjacent to each other; and
a controller configured to selectively vary the target-cathode voltage and the shield voltage.

2. The substrate holder of claim 1 further configured to have a pallet bias voltage applied to it.

3. The controller of claim 2 further configured to selectively vary the target-cathode voltage, the shield voltage and the substrate holder voltage.

4. The system of claim 1 wherein said plurality of target-cathodes comprises:
a first target-cathode having a first shield, said first target-cathode configured to be biased to a first target-cathode voltage and said first shield configured to be biased to a first shield voltage; and said controller further configured to selectively vary the first target-cathode voltage and the first shield voltage; and
a second target-cathode having a second shield, said second target-cathode configured to be biased to a second target-cathode voltage and said second shield configured to be biased to a second shield voltage; and said controller further configured to selectively vary the second target-cathode voltage and the second shield voltage.

5. The substrate holder of claim 4 further configured to have a pallet bias voltage applied to it.

6. The controller of claim 5 further configured to selectively vary the target-cathode voltage, the shield voltage and the substrate holder voltage.

7. The system of claim 1 wherein said substrate holder is a pallet capable of holding a plurality of substrates.

8. The sputter system of claim 4 wherein said first target-cathode and second target-cathode include targets made from different materials, wherein each said material is characterized by a preferred pallet bias voltage.

9. The sputter system of claim 4 in which the controller is configured to supply a voltage to pairs of the target-cathodes and shields in turn within a cycle time.

10. The sputter system of claim 2 wherein said controller includes a timing circuit for synchronizing changes in the target-cathode voltages with changes in the pallet bias voltage and with changes in the shield voltage.

11. The sputter system of claim 5 wherein the pallet is configured to move a minimal distance along the path of travel within the cycle time.

12. The sputter system of claim 1 further including a schedule for selectively supplying voltages according to time.

13. The sputter system of claim 1 further including a schedule for selectively supplying voltages according to the position of the substrate holder.

14. A sputter system comprising:
a pallet configured to have a pallet bias voltage, said pallet moveable along a path of travel;
a first target-cathode having a first shield, said first target cathode configured to be biased to a first target cathode voltage and said first shield configured to be biased to a first shield voltage;
a second target-cathode having a second shield, said second target cathode configured to be biased to a second target cathode voltage and said second shield configured to be biased to a second shield voltage wherein a portion of said first shield is positioned in between said first and second target-cathodes and a portion of said second shield is positioned in between said first and second target-cathodes;
and wherein said first target-cathode and said second target-cathode are disposed along said path of travel.

15. The sputter system of claim 14 in which said target-cathodes are spaced apart along the path of travel by a distance less than a length of the pallet.

16. The sputter system of claim 14 in which said target-cathodes are disposed on both sides of the path of travel.

17. The sputter system of claim 14 wherein said first target-cathode and said second target-cathode each include targets made from different materials, wherein each said material is characterized by a preferred pallet bias voltage.

18. The sputter system of claim 14 further including a controller configured to selectively vary the first target-cathode voltage, the second target-cathode voltage, the first shield voltage, the second shield voltage and the pallet bias voltage while the pallet moves along the path of travel.

19. The sputter system of claim 14 in which the controller is configured to supply a first target-cathode voltage, a second target-cathode voltage, a first shield voltage, and a second shield voltage in turn within a cycle time.

20. The sputter system of claim 14 wherein said controller includes a timing circuit for synchronizing changes in the target-cathode voltages with changes in the pallet bias voltage.

21. The sputter system of claim 14 wherein the pallet is configured to move a minimal distance along the path of travel within the cycle time.

22. The sputter system of claim 14 further including a schedule for selectively supplying voltages according to time.

23. The sputter system of claim 14 further including a schedule for selectively supplying voltages according to position of said pallet.

24. The sputter system of claim 22 wherein said schedule further includes timing and sequencing of voltages information.

25. A method of sputtering layers of materials onto substrates carried by a pallet, comprising the steps of:
   moving the pallet along a path of travel, the pallet being capable of having a pallet bias voltage put on it;
   applying a pallet bias voltage to said pallet;
   applying a plurality of target-cathode voltages to a plurality of target-cathodes for sputtering said materials from each target-cathode, each target-cathode having a shield electrically isolated from said target-cathode and separating said target-cathode from any adjacent target-cathodes; and
   applying a shield voltage to each shield.

26. The method of claim 25 further including the step of selectively varying said target-cathode voltage and shield voltage while said pallet is moving in front of said target-cathode.

* * * * *